United States Patent
Uchibori et al.

(10) Patent No.: US 7,625,638 B2
(45) Date of Patent: Dec. 1, 2009

(54) HYGROSCOPIC MOLDING

(75) Inventors: Teruo Uchibori, Inugami-gun (JP);
Kaneto Ohyama, Inugami-gun (JP);
Kentaro Miyazawa, Inugami-gun (JP);
Yohei Kawaguchi, Inugami-gun (JP);
Hidehiko Maki, Inugami-gun (JP);
Yusuke Nakajima, Inugami-gun (JP)

(73) Assignee: Dynic Corporation, Kyoto (JP)

( * ) Notice: Subject to any disclaimer, the term of this patent is extended or adjusted under 35 U.S.C. 154(b) by 43 days.

(21) Appl. No.: 10/520,444

(22) PCT Filed: Jul. 7, 2003

(86) PCT No.: PCT/JP03/08574

§ 371 (c)(1),
(2), (4) Date: Jan. 6, 2005

(87) PCT Pub. No.: WO2004/006628

PCT Pub. Date: Jan. 15, 2004

(65) Prior Publication Data

US 2005/0255285 A1    Nov. 17, 2005

(51) Int. Cl.
*H01L 51/54* (2006.01)
*H01J 1/62* (2006.01)
*F26B 5/04* (2006.01)

(52) U.S. Cl. .................. 428/690; 428/917; 313/504; 313/506; 313/512; 427/66; 252/181.1; 252/194; 34/417; 34/442

(58) Field of Classification Search ........... 313/512, 313/504, 506; 428/76, 323, 330, 690, 917; 252/181.1, 194
See application file for complete search history.

(56) References Cited

U.S. PATENT DOCUMENTS

| | | | | |
|---|---|---|---|---|
| 3,565,654 A * | 2/1971 | Story | ....................... | 106/243 |
| 3,862,963 A * | 1/1975 | Hoshi et al. | ............... | 502/402 |
| 4,013,566 A * | 3/1977 | Taylor | ....................... | 502/62 |
| 4,081,397 A * | 3/1978 | Booe | ....................... | 252/194 |
| 4,448,949 A * | 5/1984 | Ito et al. | ....................... | 528/99 |
| 4,873,282 A * | 10/1989 | Yui et al. | ................... | 524/496 |
| 5,078,909 A * | 1/1992 | Shigeta et al. | ............. | 252/194 |
| 5,300,858 A * | 4/1994 | Nikaido | ....................... | 313/503 |
| 5,304,419 A * | 4/1994 | Shores | ....................... | 428/355 R |
| 5,908,723 A * | 6/1999 | Malhotra et al. | ............. | 430/31 |
| 5,990,615 A | 11/1999 | Sakaguchi et al. | | |
| 6,268,071 B1 | 7/2001 | Yasukawa et al. | | |
| 6,633,123 B2 | 10/2003 | Tazawa | | |
| 6,673,436 B2 * | 1/2004 | Kawaguchi et al. | ......... | 428/330 |
| 6,686,063 B2 | 2/2004 | Kobayashi | | |
| 6,753,363 B1 * | 6/2004 | Harashina | ................... | 524/99 |
| 6,819,042 B2 * | 11/2004 | Nakada et al. | ............. | 313/504 |
| 6,924,594 B2 | 8/2005 | Ogura et al. | | |

(Continued)

FOREIGN PATENT DOCUMENTS

JP        61-96695 A        5/1986

(Continued)

*Primary Examiner*—Dawn Garrett
(74) *Attorney, Agent, or Firm*—Knobbe Martens Olson & Bear LLP

(57) ABSTRACT

The present invention provides a moisture-absorbent formed body comprising 1) an amine compound and/or a thermally conductive material, 2) a hygroscopic agent, and 3) a resin component, for removing moisture from within the sealed atmosphere of an organic electroluminescent device, and thereby suppressing the occurrence of dark spots.

14 Claims, 2 Drawing Sheets

U.S. PATENT DOCUMENTS

| | | | |
|---|---|---|---|
| 2002/0050785 | A1 | 5/2002 | Nakada et al. |
| 2003/0085654 | A1 | 5/2003 | Hayashi |

FOREIGN PATENT DOCUMENTS

| | | | |
|---|---|---|---|
| JP | 05-114486 A | | 5/1993 |
| JP | 05-290976 A | | 11/1993 |
| JP | 07-169567 | | 7/1995 |
| JP | 10-275682 | | 10/1998 |
| JP | 11-74074 | | 3/1999 |
| JP | 2000-195660 | | 7/2000 |
| JP | 2000-268954 | | 9/2000 |
| JP | 2001-267067 | | 9/2001 |
| JP | 2001-277395 A | | 10/2001 |
| JP | 2001-278999 A | | 10/2001 |
| JP | 2001-354780 | * | 12/2001 |
| JP | 2002-003717 A | | 1/2002 |
| JP | 2002-030212 A | | 1/2002 |
| JP | 2002-043055 | | 2/2002 |
| JP | 2002-124375 | | 4/2002 |
| JP | 2002-164481 A | | 6/2002 |
| JP | 2002-280166 A | | 9/2002 |
| JP | 2002-299040 A | | 10/2002 |
| JP | 2003-133061 A | | 5/2003 |
| JP | 2003-142253 A | | 5/2003 |
| JP | 2003-288980 | | 10/2003 |
| JP | 2003-288981 | | 10/2003 |
| JP | 2004-31182 | | 1/2004 |
| JP | 2004-235077 | | 8/2004 |
| JP | 2004-311246 | | 11/2004 |
| JP | 2004-311345 | | 11/2004 |
| WO | WO 01/31717 A1 | | 5/2001 |
| WO | WO 02/096160 A1 | | 11/2002 |

* cited by examiner

HYGROSCOPIC MOLDING

This application is the U.S. National Phase under 35 U.S.C. §371 of International Application PCT/JP2003/008754, filed on Jul. 7, 2003, which claims priority of Japanese Patent Application Nos. 2002-198922 and 2002-214029, filed on Jul. 8, 2002 and Jul. 23, 2002 respectively. The International Application was published under PCT Article 21(2) in a language other than English.

TECHNICAL FIELD

This invention relates to a moisture-absorbent formed body used in organic electroluminescent devices and the like.

BACKGROUND ART

Electronic devices such as batteries, capacitors, and display devices continue their trend toward miniaturization and reduced weight. These electronic parts are always sealed with a resin-based adhesive such as a UV-setting resin or a rubber-based sealing material in the course of sealing the outer housing. These sealing methods, however, can lead to a decrease in the performance of the electronic parts because of moisture that passes through the sealing material during storage or use.

In particular, in the case of an organic electroluminescent device, when moisture infiltrates the interior, it can result in modification of the constituent materials or separation between the light-emitting layer and the electrode layer. This results in non-light-emitting regions known as dark spots, which are a serious problem in that they prevent the desired light emission performance from being obtained.

Accordingly, there have been various proposals for methods to remove infiltrating moisture by disposing a moisture-absorbent material within an organic electroluminescent device (such as Japanese Unexamined Patent Publications 2000-195660 and 2002-43055). A method for preventing a drop in the performance of an organic electroluminescent device by removing the gas that is generated from sealing adhesives has also been proposed (Japanese Unexamined Patent Publication H11-74074).

Even with these approaches, however, it is still difficult to effectively prevent the occurrence of dark spots in organic electroluminescent devices, or to prevent the growth of dark spots that have already occurred, and there is room for improvement in this area.

Meanwhile, many electronic devices generate heat. For instance, in the case of an organic electroluminescent device, the majority of the electrical energy is converted into thermal energy, so excess heat is generated within the device. The amount of heat generated is particularly large with organic electroluminescent devices that increase surface brightness for illumination and other such applications, or with organic electroluminescent devices that display video graphics. If this heat builds up within an electronic device, the organic light emitting layer may deteriorate, which has an adverse effect on the service life of an organic electroluminescent device. It is therefore preferable for an electronic device to be made from materials that radiate heat as much as possible.

Therefore, an object of the present invention is to solve these problems encountered with prior art and provide a material with which water can be easily and reliably removed. It is a further object of the present invention to provide a material for suppressing the formation of dark spots in organic electroluminescent devices, or for suppressing the growth of dark spots that do have occurred.

DISCLOSURE OF THE INVENTION

The inventors arrived at the present invention upon discovering that the stated object can be achieved with a moisture-absorbent formed body having a specific composition.

Specifically, the present invention relates to the following moisture-absorbent formed body.

1. A moisture-absorbent formed body comprising 1) an amine compound and/or a thermally conductive material, 2) a hygroscopic agent, and 3) a resin component.

2. The moisture-absorbent formed body for an organic electroluminescent device according to 1 above, wherein the hygroscopic agent contains an alkaline earth metal oxide and/or a sulfate.

3. The moisture-absorbent formed body according to 1 above, wherein the hygroscopic agent is at least one type selected from the group consisting of CaO, BaO and SrO 4. The moisture-absorbent formed body according to 1 above, wherein a powder with a specific surface area of at least 10 $m^2/g$ is used as the hygroscopic agent.

5. The moisture-absorbent formed body according to 1 above, wherein the hygroscopic agent is contained in the moisture-absorbent formed body in an amount of 40 to 95 wt %.

6. The moisture-absorbent formed body according to 1 above, wherein the resin component is at least one type of polymer material selected from the group consisting of fluororesins, polyolefin resins, polyacrylic resins, polyacrylonitrile resins, polyamide resins, polyester resins, and epoxy resins.

7. The moisture-absorbent formed body according to 1 above, wherein the amine compound is a hydrazide compound.

8. The moisture-absorbent formed body according to 1 above, wherein the thermally conductive material is at least one type selected from the group consisting of carbon materials, nitrides, carbides, oxides, and metal materials.

9. The moisture-absorbent formed body according to 1 above, obtained by molding a mixture comprising 1) an amine compound and/or a thermally conductive material, 2) a hygroscopic agent, and 3) a resin component into a formed body, and then heat-treating this formed body.

10. The moisture-absorbent formed body according to 1 above, wherein the thermal conductivity is at least 0.3 W/mK.

11. The moisture-absorbent formed body according to 1 above, wherein the density is at least 1 $g/cm^3$.

12. A moisture-absorbent formed body for an organic electroluminescent device, which is the formed body according to 1 above and is disposed within the sealed atmosphere of an organic electroluminescent device.

13. An organic electroluminescent device, wherein the moisture-absorbent formed body according to 1 above is disposed within the sealed atmosphere of an organic electroluminescent device.

14. The organic electroluminescent device according to 13 above, wherein the moisture-absorbent formed body is in direct or indirect contact with an electrode of the organic electroluminescent device.

15. A method for removing moisture from within the sealed atmosphere of an organic electroluminescent device by disposing the moisture-absorbent formed body according to 1 above within said sealed atmosphere.

16. A method for suppressing the occurrence of dark spots in an organic electroluminescent device by disposing the moisture-absorbent formed body according to 1 above within the sealed atmosphere of said organic electroluminescent device.

<Moisture-Absorbent Formed Body>

The moisture-absorbent formed body of the present invention comprising 1) an amine compound and/or a thermally conductive material, 2) a hygroscopic agent, and 3) a resin component.

Hygroscopic Agent

The hygroscopic agent can be a substance having at least the function of being able to adsorb moisture, but is preferably a compound which chemically adsorbs moisture and remains in the form of a solid even after absorbing moisture. Among examples of such compounds include various metal oxides and salts of metals with inorganic or organic acids, but it is particularly favorable to use at least one member of the group consisting of alkaline earth metal oxides and sulfates.

Examples of alkaline earth metal oxides include calcium oxide (CaO), barium oxide (BaO), magnesium oxide (MgO), and strontium oxide (SrO).

Examples of sulfates include lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$), and nickel sulfate ($NiSO_4$). In addition to the above, organic compounds having hygroscopic properties can also be used as the hygroscopic agent of the present invention.

As alkaline earth metal oxide is preferred as the hygroscopic agent of the present invention. Particularly preferred is at least one member of the group consisting of CaO, BaO and SrO. The most preferred is CaO.

The hygroscopic agent is preferably contained in the form of a powder. In this case, the specific surface area (BET specific surface area) of the powder is not limited, but may be suitably selected according to the type of hygroscopic agent, the desired hygroscopic performance, and so forth. For example, when strontium oxide is used as the hygroscopic agent, its specific surface area can be at least $2\ m^2/g$. When calcium oxide is used as the hygroscopic agent, its specific surface area is usually at least $10\ m^2/g$, with at least $30\ m^2/g$ being preferable, and at least $40\ m^2/g$ being particularly favorable. CaO (powder) obtained by heating calcium hydroxide at 900° C. or lower (preferably 700° C. or lower, and particularly 500° C. or lower (especially from 490 to 500° C.)) can be used to advantage as the hygroscopic agent, for example. With the present invention, a CaO powder whose BET specific surface area is at least $10\ m^2/g$, and preferably at least $30\ m^2/g$, and particularly at least $40\ m^2/g$, can be used most favorably.

Resin Component

There are no particular restrictions on the resin component, as long as it does not hinder the water-removing action of the hygroscopic agent, and a gas-permeable polymer (that is, a polymer material having low gas barrier properties) can be used favorably. Examples include fluororesins, polyolefin resins, polyacrylic resins, polyacrylonitrile resins, polyamide resins, polyester resins, epoxy resins, and polycarbonate resins. The gas permeability may be suitably set as dictated by the intended use and desired characteristics of the end product.

With the present invention, among these polymer materials, fluororesins and polyolefin resins are preferred. Specific examples of fluororesin include polytetrafluoroethylene, polychlorotrifluoroethylene, polyvinylidene fluoride, and ethylene-tetrafluoroethylene copolymer, or the like. Examples of polyolefin resins include polyethylene, polypropylene, polybutadiene, and polyisoprene, as well as copolymers of these. Among these resin components, fluororesins are preferred in the present invention.

The contents of the hygroscopic agent and resin component depends on the types of components in question and so forth, but the usual proportions based on a combined 100 wt % of the hygroscopic agent and resin component are about 30 to 95 wt % hygroscopic agent and about 70 to 5 wt % resin component. Preferably, the amounts are about 50 to 85 wt % hygroscopic agent and about 50 to 15 wt % resin component, and the most preferred amounts are about 55 to 85 wt % hygroscopic agent and about 45 to 15 wt % resin component.

Amine Compound

In the present invention, the amine compound contributes particularly to preventing the occurrence of dark spots and to suppressing the growth of any dark spots that do occur. A commercially available amine compound can be used. More specifically, it is preferable to use one or more members of the group consisting of hydrazide compounds, naphthylamine compounds, diphenylamine compounds, and p-phenylenediamine compounds.

There are no particular restrictions on the hydrazide compound, but examples include monohydrazide compounds having one hydrazide group per molecule, dihydrazide compounds having two hydrazide groups per molecule, and polyhydrazide compounds having three or more hydrazide groups per molecule.

More specifically, the hydrazide compounds listed in Japanese Patent No. 3,069,845 can be used. Specifically, examples include lauric acid hydrazide, salicylic acid hydrazide, formhydrazide, acetohydrazide, propionic acid hydrazide, p-hydroxybenzoic acid hydrazide, naphthoic acid hydrazide, 3-hydroxy-2-naphthoic acid hydrazide, and other such monohydrazide compounds; oxalic acid dihydrazide, malonic acid dihydrazide, succinic acid dihydrazide, adipic acid dihydrazide, azelaic acid dihydrazide, sebacic acid dihydrazide, dodecanedioic acid dihydrazide, maleic acid dihydrazide, fumaric acid dihydrazide, diglycolic acid dihydrazide, tartaric acid dihydrazide, malic acid dihydrazide, isophthalic acid dihydrazide, terephthalic acid dihydrazide, dimeric acid dihydrazide, 2,6-naphthoic acid dihydrazide, and other such dihydrazide compounds; and polyacrylic acid hydrazide and other such polyhydrazide compounds.

Examples of naphthylamine compounds include phenyl-α-naphthylamine, phenyl-β-naphthylamine, or the like.

Examples of diphenylamine compounds include p-(p-toluene.sulfonylamide)-diphenylamine, 4,4'-(α,α-dimethylbenzyl)diphenylamine, 4,4'-dioctyl.diphenylamine, octylated diphenylamine, dioctylated diphenylamine, and p,p'-dioctyl.diphenylamine.

Examples of p-phenylenediamine compounds include N,N'-diphenyl-p-phenylenediamine, N-isopropyl-N'-phenyl-p-phenylenediamine, N,N'-di-2-naphthyl-p-phenylenediamine, N-cyclohexyl-N'-phenyl-p-phenylenediamine, N-phenyl-N'-(3-methacryloyloxy-2-hydroxypropyl)-p-phenylenediamine, N,N'-bis(1-methylheptyl)-p-phenylenediamine, and N,N'-bis(1,4-dimethylpentyl)-p-phenylenediamine.

Among these amine compounds, a hydrazide compound is preferred in the present invention.

The amine compound content is suitably selected according to the type of amine compound being used and other such factors, but is usually about 1 to 10 wt %, and preferably 1 to 5 wt %, in the moisture-absorbent formed body.

Thermally Conductive Material

Because it contains a thermally conductive material, the moisture-absorbent formed body of the present invention exhibits excellent thermal conductivity (thermal radiation). Therefore, when the formed body of the present invention is incorporated in an organic electroluminescent device, for example, it extends the service life of the device.

There are no particular restrictions on the thermally conductive material, but examples include carbon black, acetylene black, ketjen black, and other such carbon materials; boron nitride, aluminum nitride, silicon nitride and other such nitrides; carbides such as boron carbide; aluminum oxide, magnesium oxide, and other such oxides; and iron, aluminum, and other such metal materials. One of these materials can be suitably selected according to the intended use and application of the moisture-absorbent formed body of the present invention and other such factors. Among these thermally conductive materials, one or more members of the group consisting of acetylene black, boron nitride and iron can be used to particular advantage with the present invention.

The thermally conductive material is usually used in the form of a powder. In general, it is preferable for the average particle diameter to be about 0.04 to 50 μm.

The amount in which the thermally conductive material is contained may be suitably selected according to the type of material and other such factors, but this material generally accounts for about 2 to 35 wt %, and preferably 2 to 25 wt %, and even more preferably 2 to 20 wt %, of the moisture-absorbent formed body of the present invention. Thermal radiation and moisture absorption can be achieved more effectively by setting the content of the various components within the ranges given above.

The moisture-absorbent formed body of the present invention preferably has a thermal conductivity of at least 0.3 W/mK, with at least 0.4 W/mK being particularly favorable, and at least 0.6 W/mK being even better. The upper limit to thermal conductivity will vary with the density of the moisture-absorbent formed body, the type and amount of thermally conductive material being used, and other such factors, but is approximately 1 W/mK from the standpoint of not hindering moisture absorptivity. Because it has the above-mentioned thermal conductivity, this moisture-absorbent formed body exhibits excellent thermal radiation while retaining the desired moisture absorptivity.

In addition to these various components, the formed body of the present invention may also contain other components (such as a colorant) as needed.

Moisture-Absorbent Formed Body

There are no particular restrictions on the shape of the moisture-absorbent formed body of the present invention, which may be suitably selected according to the application and intended use of the end product, the place of use, and other such factors, but examples include the shape of a sheet, pellets, a board, a film, granules, cotton, and a string (strand).

The density of the moisture-absorbent formed body of the present invention depends on the composition and so forth, but the density can be suitably selected so that the moisture-absorbent formed body will have a thermal conductivity of at least 0.3 W/mK. The density is generally at least 1 g/cm$^3$, and preferably at least 1.2 g/cm$^3$. The upper limit for density can be suitably selected according to the desired moisture absorptivity.

The moisture-absorbent formed body of the present invention can be obtained by uniformly mixing these components and molding them into the desired shape. In this case, it is preferable to add the hygroscopic agent, the amine compound, and so forth after they have been thoroughly dried. In the mixing with the resin component, the resin component may be heated and put in a molten state as needed. Any known molding or granulation method can be employed for the molding method, but examples include press molding (including hot press molding), extrusion, and so forth, as well as granulation with a tumbling granulator, biaxial granulator, or the like.

The moisture-absorbent formed body of the present invention can be favorably manufactured by press molding. More specifically, this is a method in which a formed body is obtained by press molding a mixture of a hygroscopic agent, a resin component, and a thermally conductive material. It is preferable to employ a method for manufacturing a moisture-absorbent formed body wherein pressing is performed such that the thermal conductivity of the resulting formed body will be at least 0.3 W/mK (and particularly at least 0.4 W/mK, and especially at least 0.6 W/mK). That is, with the present invention, it is preferable to press and raise the density until the above-mentioned thermal conductivity is achieved.

If the moisture-absorbent formed body is in the shape of a sheet, this sheet can be further subjected to drawing, the product of which can also be used favorably as a moisture-absorbent sheet. This drawing may be performed by a known method, and may be uniaxial drawing, biaxial drawing, or the like.

The thickness of the sheet when the moisture-absorbent formed body of the present invention is in the form of a sheet may be suitably set according to the intended use of the end product, but is usually about 50 to 400 μm, and preferably 100 to 200 μm.

The resin component of the moisture-absorbent formed body of the present invention is preferably fibrillated. Fibrillation allows even better moisture absorptivity to be exhibited. This fibrillation may be performed simultaneously with the molding of the moisture-absorbent formed body, or by working after the molding. For example, a mixture obtained by dry mixing a resin component and a hygroscopic agent can be drawn to fibrillate the resin component. Also, for example, the formed body of the present invention can be fibrillated by further performing drawing as discussed above. More specifically, a fibrillated moisture-absorbent formed body can be manufactured by dry mixing a powdered hygroscopic agent comprising at least one member of the group consisting of CaO, BaO and SrO with a powdered fluororesin (such as polytetrafluoroethylene) and then rolling the resulting mixture. The rolling or drawing may be carried out using a known apparatus. The degree of fibrillation can be suitably adjusted according to the intended use and desired characteristics of the end product. There are no particular restrictions on the powdered hygroscopic agent, but a known or commercially available fluororesin powder can be used.

It is also preferable for the moisture-absorbent formed body of the present invention to have been heat-treated. In particular, applying a heat treated moisture-absorbent formed body to an organic electroluminescent device affords an even better effect in terms of suppressing the occurrence of dark spots. The heat treatment conditions will vary with the composition of the formed body, the desired moisture absorptivity, and so forth, but 140 to 240° C., and particularly 160 to 180° C., is generally preferable. The heat treatment time can be selected according to the heat treatment temperature and so forth. There are no particular restrictions on the heat treatment atmosphere, but an inert gas atmosphere or a vacuum is preferred.

The moisture-absorbent formed body of the present invention can be installed by a standard method at a suitable site or part in the interior of an organic electroluminescent device. For instance, it can be fixed to all or part of the inner surface of the sealed can (container) of an organic electroluminescent device. Also, when moisture is absorbed into an organic electrolyte in a capacitor, battery, or the like that makes use of an organic electrolyte, the moisture-absorbent formed body may be present in the organic electrolyte.

When the moisture-absorbent formed body of the present invention is used for an organic electroluminescent device, there are no particular restrictions on how the formed body is fixed, as long as it can be securely affixed to the inner wall of a sealed can or the like, but examples include a method in which the moisture-absorbent formed body is affixed to the inner surface of the sealed can with a known pressure-sensitive adhesive tape, an adhesive agent (preferably a solventless adhesive), or the like, a method in which the moisture-absorbent formed body is heat-fused to the inner surface of the sealed can, and a method in which the moisture-absorbent formed body is fixed to the inner surface of the sealed can with screws or other such fixing members.

<Organic Electroluminescent Device>

The present invention also encompasses an organic electroluminescent device comprising a moisture-absorbent formed body, wherein the moisture-absorbent formed body is a moisture-absorbent formed body of the present invention, wherein the moisture-absorbent formed body is disposed inside the sealed atmosphere of the device.

The organic electroluminescent device is one in which the moisture-absorbent formed body of the present invention is disposed within a sealed atmosphere (inside a sealed can), and the moisture-absorbent formed body is preferably in direct or indirect contact with both the inner surface of the sealed container (the inner surface of the sealed can) and an electrode. With the present invention, the shape of the moisture-absorbent formed body, the layout, and so forth can be suitably set so as to allow contact with an electrode of the organic electroluminescent device. This makes it possible to perform moisture absorption within the sealed atmosphere, and also to efficiently release any heat generated within the organic electroluminescent device to the outside through the formed body of the present invention.

The contact between the formed body of the present invention and an electrode and/or the inner surface of the sealed container may or may not be such that these components are bonded or joined together. There are no restrictions on how this contact is achieved, as long as heat generated within the organic electroluminescent device can be released to the outside through the formed body of the present invention. Specifically, in addition to the components being in direct contact with each other, the present invention also encompasses a situation in which a third layer, such as a cushioning filler sheet or an adhesive layer (thermally conductive adhesive layer), is interposed between the formed body of the present invention and an electrode and/or the inner surface of the sealed container, so that these components are indirectly touching.

FIG. 1 is a simplified cross section of an organic electroluminescent device in which the moisture-absorbent formed body of the present invention has been disposed inside the sealed can. For example, as shown in FIG. 1a, the inner surface of the sealed can 1 and one side of a sheet-form moisture-absorbent formed body 2 are in contact with each other, and the other side of this moisture-absorbent formed body is indirectly touching (contiguous with) one side of an electrode 4 via a thermally conductive adhesive layer 3. Another example is shown in FIG. 1b, in which one side of the moisture-absorbent formed body 2 is disposed so as to be in contact with the inner surface of the sealed can 1 via the thermally conductive adhesive layer 3, and the other side of the formed body is in contact with one side of the electrode 4. Yet another example is shown in FIG. 1c, in which one side of the sheet-form moisture-absorbent formed body 2 is disposed so as to be in contact with the inner surface of the sealed can 1, and the other side of the formed body is in contact with one side of the electrode 4.

The moisture-absorbent formed body of the present invention has good moisture absorptivity and excellent thermal conductivity, so any moisture that has infiltrated the interior of an electronic device such as an organic electroluminescent device can be easily and reliably removed, and at the same time, any heat generated within the electronic device can be efficiently released to the outside. Accordingly, the electronic device can be protected from the deterioration of its parts that would otherwise be caused by moisture and heat, and as a result the performance of the electronic device can be maintained over a longer period of time.

The moisture-absorbent formed body of the present invention having these features can be utilized in fields that require thermal radiation and moisture absorption. For instance, the present invention can be used in a wide range of applications including electronic materials, mechanical materials, automobiles, communications equipment, construction materials, medical materials, and precision machinery. The present invention can be used to particular advantage in organic electroluminescent devices.

Also, with the moisture-absorbent formed body for an organic electroluminescent device of the present invention, any moisture that has infiltrated the interior of an organic electroluminescent device can be easily and reliably removed, which in turn prevents the occurrence of dark spots, or effectively suppresses the growth of dark spots that have already occurred.

BEST MODE FOR CARRYING OUT THE INVENTION

Figure 1:
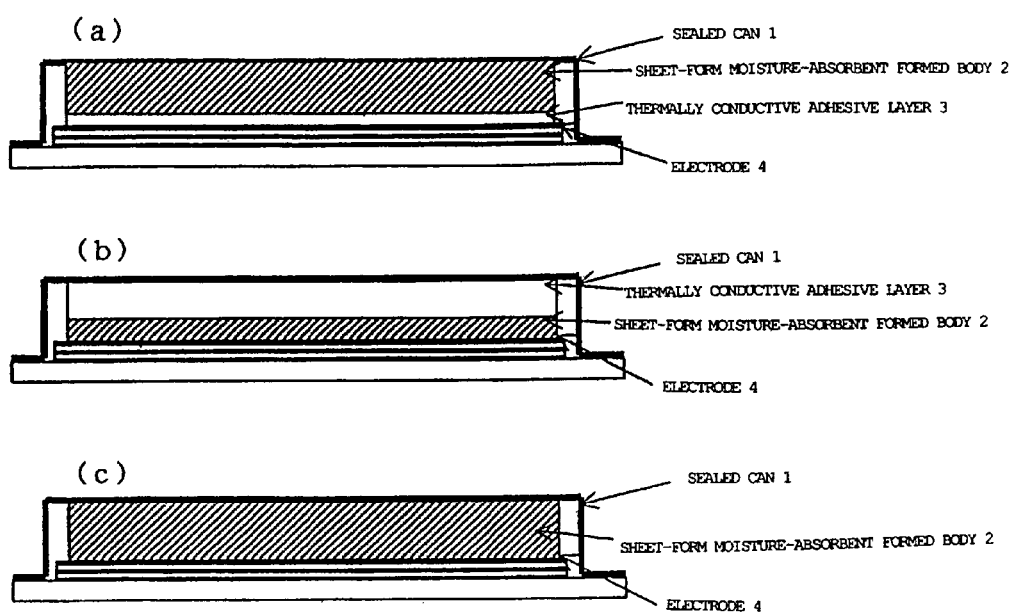
FIG. 1 is a simplified cross section of an organic electroluminescent device in which the moisture-absorbent formed body of the present invention has been disposed.

The features of the present invention will now be further clarified through examples, but the scope of the present invention is not limited by these examples.

Example 1.1

A sheet-form moisture-absorbent formed body was produced as follows.

60 wt % CaO powder (average particle size: 10 μm) with a BET specific surface area of 45 m$^2$/g was used as the hygroscopic agent, 5 wt % hydrazide compound (trade name "Chemcatch H-6000", made by Otsuka Chemical) was used as the amine compound, and 35 wt % fluororesin (polytetrafluoro-ethylene (PTFE)) was used as the resin component. These components were thoroughly mixed in the form of powders. The resulting mixture was formed into a sheet with a calender roll, which gave a sheet with a thickness of 200 μm. This sheet was subjected to heat treatment for 10 minutes at 180° C. The sheet thus obtained had a porous structure containing CaO, and in which the PTFE resin was fibrillated.

Example 1.2

A sheet-form moisture-absorbent formed body having a thickness of 200 μm was obtained in the same manner as in Example 1.1 except that 60 wt % SrO powder (average particle size: 10 μm) with a BET specific surface area of 3 $m^2/g$ was used as the hygroscopic agent, 5 wt % hydrazide compound (trade name "Chemcatch H-6000", made by Otsuka Chemical) was used as the amine compound, and 35 wt % fluororesin (polytetrafluoro-ethylene (PTFE)) was used as the resin component.

Example 1.3

A sheet-form moisture-absorbent formed body with a thickness of 200 μm was obtained in the same manner as in Example 1.1 except that 60 wt % CaO powder (average particle size: 10 μm) with a BET specific surface area of 45 $m^2/g$ was used as the hygroscopic agent, 5 wt % N,N'-di-2-naphthyl-p-phenyldiamine (trade name "Nocrac White", made by Ouchi Shinko Chemical Industries) was used as the amine compound, and 35 wt % fluororesin (polytetrafluoro-ethylene (PTFE)) was used as the resin component.

Comparative Example 1.1

60 wt % CaO powder (average particle size: 10 μm) with a BET specific surface area of 45 $m^2/g$ was used as the hygroscopic agent, and 40 wt % fluororesin (polytetrafluoro-ethylene (PTFE)) was used as the resin component. A sheet-form moisture-absorbent formed body with a thickness of 200 μm was obtained in the same manner as in Example 1.1.

Comparative Example 1.2

60 wt % CaO powder (average particle size: 10 μm) with a BET specific surface area of 45 $m^2/g$ was used as the hygroscopic agent, 5 wt % activated carbon (BET specific surface area: 2000 $m^2/g$) was used, and 35 wt % fluororesin (PTFE) was used as the resin component. These components were thoroughly mixed in the form of powders. The resulting mixture was formed into a sheet with a calender roll, which gave a sheet with a thickness of 200 μm. The sheet thus obtained had a porous structure containing CaO, and in which the PTFE resin was fibrillated.

Comparative Example 1.3

60 wt % CaO powder (average particle size: 10 μm) with a BET specific surface area of 45 $m^2/g$ was used as the hygroscopic agent, 5 wt % adsorbent ("Mizukanite HP," made by Mizusawa Industrial Chemicals; a porous amphoteric adsorbent composed of silica, alumina, or another such metal oxide) was used, and 35 wt % fluororesin (PTFE) was used as the resin component. These components were thoroughly mixed in the form of powders. The resulting mixture was formed into a sheet with a calender roll, which gave a sheet with a thickness of 200 μm. The sheet thus obtained had a porous structure containing CaO, and in which the PTFE resin was fibrillated.

Test Example 1.1

Degradation of an organic electroluminescent device was evaluated.

The sheet-form moisture-absorbent formed bodys obtained in Examples 1.1 to 1.3 and Comparative Examples 1.1 to 1.3 were each sealed inside the stainless steel sealed can of an organic electroluminescent device. Each organic electroluminescent device containing a moisture-absorbent formed body was subjected to an accelerated aging test.

In this test, the organic electroluminescent device was left in an atmosphere with a temperature of 60° C. and a relative humidity of 90%, and the change in the light emitting portion was examined. The width of the dark area around the light emitting portion was subjected to fixed point observation and measurement with a CCD camera. The change in the initial value thereof was measured at 100, 200, and 500 hours. These measurement results are given in Table 1 and FIG. 2.

TABLE 1

| | Growth of dark area (μm) | | |
|---|---|---|---|
| | 100 hours | 200 hours | 500 hours |
| Example 1.1 | 0.2 | 0.2 | 0.2 |
| Example 1.2 | 0.2 | 0.2 | 0.2 |
| Example 1.3 | 1.3 | 3.1 | 5.2 |
| Comparative Ex. 1.1 | 7.0 | 11.5 | 15.0 |
| Comparative Ex. 1.2 | 8.0 | 12.75 | 16.25 |
| Comparative Ex. 1.3 | 7.25 | 12.0 | 15.5 |

Figure 2:
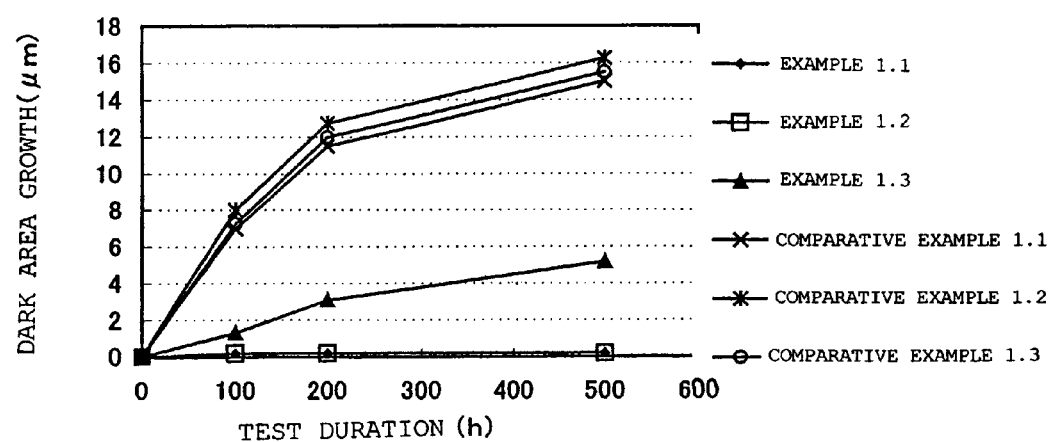
FIG. 2 is a graph of the change in dark area of a moisture-absorbent formed body obtained in an example.

It can be seen from the results in Table 1 and FIG. 2 that the moisture-absorbent formed bodies of the examples exhibit superior performance when used for an organic electroluminescent device.

Examples 2.1 to 2.4 and Comparative Examples 2.1 to 2.6

Sheet-form moisture-absorbent formed bodies having the compositions listed in Table 2 were produced.

TABLE 2

| | Hygroscopic agent | Resin | Thermally conductive material | | | Density | Thermal conductivity | Moisture |
|---|---|---|---|---|---|---|---|---|
| | CaO | PTFE | Fe | AB | BN | (g/cm$^3$) | (W/mK) | absorption (g) |
| Ex. 2.1 | 60 parts | 40 parts | 5 parts | — | — | 1.62 | 0.40 | 0.029 |
| Ex. 2.2 | 60 parts | 40 parts | 20 parts | — | — | 1.78 | 0.36 | 0.031 |
| Ex. 2.3 | 60 parts | 40 parts | — | 5 parts | — | 1.75 | 0.43 | 0.034 |
| Ex. 2.4 | 60 parts | 40 parts | — | — | 20 parts | 1.40 | 0.86 | 0.025 |

TABLE 2-continued

| | Hygroscopic agent | Resin | Thermally conductive material | | | Density | Thermal conductivity | Moisture |
|---|---|---|---|---|---|---|---|---|
| | CaO | PTFE | Fe | AB | BN | (g/cm$^2$) | (W/mK) | absorption (g) |
| C. E. 2.1 | 60 parts | 40 parts | 5 parts | — | — | 0.72 | 0.14 | 0.016 |
| C. E. 2.2 | 60 parts | 40 parts | 20 parts | — | — | 0.80 | 0.16 | 0.014 |
| C. E. 2.3 | 60 parts | 40 parts | — | 5 parts | — | 0.87 | 0.17 | 0.018 |
| C. E. 2.4 | 60 parts | 40 parts | — | — | 20 parts | 0.69 | 0.17 | 0.013 |
| C. E. 2.5 | 60 parts | 40 parts | — | — | — | 0.99 | 0.16 | 0.015 |
| C. E. 2.6 | — | 100 parts | — | — | — | 0.71 | 0.18 | 0.000 |

The various components were uniformly mixed in the form of powders, and the resulting mixture was formed into a sheet with a calender roll to manufacture a sheet with a thickness of 0.5 mm. Next, to increase the density of the sheet, the sheet was compressed in its thickness direction, which produced a sheet with a thickness of 0.25 mm. Sheets (0.25 mm thick) having the same density as the sheets with a thickness of 0.5 mm in the various examples were manufactured as Comparative Examples 2.1 to 2.6.

The following were used as the components listed in Table 2.

(1) Resin Component
 fluororesin (polytetrafluoroethylene (PTFE)), powdered (2) Hygroscopic Agent
 calcium oxide (CaO), BET specific surface area of 40 m$^2$/g, average particle size of 5 μm (3) Thermally Conductive Material
 acetylene black powder, average particle size of 0.04 μm (trade name "Denka Black," made by Denki Kagaku Kogyo)
 iron powder, average particle size of 50 μm (reagent made by Wako Pure Chemicals)
 boron nitride powder, average particle size of 10 μm (trade name "HP-1," made by Mizushima Ferroalloy)

Test Example 2.1

The sheets obtained in the examples and comparative examples were examined for density, moisture absorption, and thermal conductivity. These results are given in Table 2. The various properties were measured as follows.

(1) Density
The density was calculated by dividing the weight of a sheet by its volume (width×length×thickness).

(2) Moisture Absorption
A sample measuring 2 cm×3 cm×0.5 mm (or 0.25 mm) in thickness was put in a thermohygrostatic chamber with a temperature of 20° C. and a humidity of 65%, and the increase in the weight of the sample was measured after 60 minutes with an electronic balance.

(3) Thermal Conductivity
A sample measuring 10 cm×5 cm×0.5 mm (or 0.25 mm) in thickness was measured using a thermal conductivity measurement apparatus "QTM-500" (made by Kyoto Denshi Kogyo). The measurement conditions were as follows.

(1) Measurement environment: in a glove box, at a dew point of −35 to −40° C. and a temperature of approximately 25 to 35° C.

(2) Reference samples: polyethylene (λ=0.0389, current value=0.25), silicon (λ=0.2522, current value=2.00), quartz glass (λ=1.468, current value=4.00)

(3) Measurement time: 1 minute (4) Measurement points: at least 3 points for each sample (a total of at least 9 points)

A comparison of the examples and comparative examples clearly reveals that with the present invention, raising the density of the sheet maintains or improves moisture absorptivity while producing superior thermal conductivity (thermal radiation).

The invention claimed is:

1. An organic electroluminescent device comprising a sealed atmosphere and a moisture-absorbent formed body in the form of a sheet disposed within the sealed atmosphere, said body comprising 1) an amine compound, 2) a hygroscopic agent, and 3) a resin component,
 wherein the amine compound is one or more members selected from the group consisting of hydrazide compounds, naphthylamine compounds and diphenylamine compounds, wherein the hydrazide compounds are selected from the group consisting of lauric acid hydrazide, salicylic acid hydrazide, formhydrazide, acetohydrazide, propionic acid hydrazide, p-hydroxybenzoic acid hydrazide, naphthoic acid hydrazide, 3-hydroxy-2-naphthoic acid hydrazide, a dihydrazide compound, and a polyhydrazide compound,
 wherein the resin component is at least one polymer material selected from the group consisting of fluororesins, polyolefin resins, polyacrylic resins, polyacrylonitrile resins, polyamide resins and polyester resins.

2. The organic electroluminescent device according to claim 1, wherein the hygroscopic agent contains an alkaline earth metal oxide, a sulfate, or both of foregoing.

3. The organic electroluminescent device according to claim 1, wherein the hygroscopic agent is at least one selected from the group consisting of CaO, BaO and SrO.

4. The organic electroluminescent device according to claim 1, wherein a powder having a specific surface area of 10 m$^2$/g or more is used as the hygroscopic agent.

5. The organic electroluminescent device according to claim 1, wherein the hygroscopic agent is contained in the moisture-absorbent formed body in an amount of 40 to 95 wt %.

6. The organic electroluminescent device according to claim 1, wherein said body has a density of at least 1 g/cm³.

7. The organic electroluminescent device according to claim 1 further comprising a thermally conductive material, wherein the thermally conductive material is one or more members selected from the group consisting of boron nitride, aluminum nitride, silicon nitride, boron carbide, aluminum oxide, magnesium oxide and iron.

8. The organic electroluminescent device according to claim 7, wherein the thermal conductivity is at least 0.3 W/mK.

9. An organic electroluminescent device comprising a moisture-absorbent formed body in the form of a sheet, said body comprising 1) an amine compound, 2) a hygroscopic agent, and 3) a resin component,
wherein the amine compound is one or more members selected from the group consisting of hydrazide compounds, naplithylamine compounds and diphenylamine compounds, and p-phenylenediamine compounds, wherein the hydrazide compounds are selected from the group consisting of lauric acid hydrazide, salicylic acid hydrazide, formhydrazide, acetohydrazide, propionic acid hydrazide, p-hydroxybenzoic acid hydrazide, naphthoic acid hydrazide, 3-hydroxy-2-naphthoic acid hydrazide, a dihydrazide compound, and a polyhydrazide compound, and
wherein the resin component is at least one polymer material selected from the group consisting of fluororesins, polyolefin resins, polyacrylic resins, polyacrylonitrile resins, polyamide resins and polyester resins and wherein the moisture absorbent body is disposed within a sealed atmosphere of the organic electroluminescent device.

10. The organic electroluminescent device according to claim 9, wherein the moisture-absorbent formed body is in direct or indirect contact with an electrode of the organic electroluminescent device.

11. A method for removing moisture within a sealed atmosphere of an organic electroluminescent device by disposing within said sealed atmosphere a moisture-absorbent formed body in the form of a sheet, said body comprising 1) an amine compound, 2) a hygroscopic agent, and 3) a resin component,
wherein the amine compound is one or more members selected from the group consisting of hydrazide compounds, naphthylamine compounds and diphenylamine compounds, and p-phenylenediamine compounds, wherein the hydrazide compounds are selected from the group consisting of lauric acid hydrazide, salicylic acid hydrazide, formhydrazide, acetohydrazide, propionic acid hydrazide, p-hydroxybenzoic acid hydrazide, naphthoic acid hydrazide, 3-hydroxy-2-naphthoic acid hydrazide, a dihydrazide compound, and a polyhydrazide compound, and
wherein the resin component is at least one polymer material selected from the group consisting of fluororesins, polyolefin resins, polyacrylic resins, polyacrylonitrile resins, polyamide resins and polyester resins.

12. The method of claim 11, wherein the removal of moisture results in suppressing the formation of dark spots in the organic electroluminescent device.

13. A moisture-absorbent formed body in the form of a sheet, said body comprising 1) an amine compound, 2) a hygroscopic agent, and 3) a resin component,
wherein the amine compound is a dihydrazide compound selected from the group consisting of oxalic acid dihydrazide, malonic acid dihydrazide, succinic acid dihydrazide, adipic acid dihydrazide, azelaic acid dihydrazide, sebacic acid dihydrazide, dodecanedioic acid dihydrazide, maleic acid dihydrazide, fumaric acid dihydrazide, diglycolic acid dihydrazide, tartaric acid dihydrazide, malic acid dihydrazide, isophthalic acid dihydrazide, terephthalic acid dihydrazide, dimeric acid dihydrazide, and 2,6 naphthoic acid dihydrazide, and
wherein the resin component is at least one polymer material selected from the group consisting of fluororesins, polyolefin resins, polyacrylic resins, polyacrylonitrile resins, polyamide resins and polyester resins.

14. A moisture-absorbent formed body in the form of a sheet, said body comprising 1) an amine compound, 2) a hygroscopic agent, and 3) a resin component,
wherein the amine compound is polyacrylic acid hydrazide, and
wherein the resin component is at least one polymer material selected from the group consisting of fluororesins, polyolefin resins, polyacrylic resins, polyacrylonitrile resins, polyamide resins and polyester resins.

* * * * *

UNITED STATES PATENT AND TRADEMARK OFFICE
CERTIFICATE OF CORRECTION

| | |
|---|---|
| PATENT NO. | : 7,625,638 B2 |
| APPLICATION NO. | : 10/520444 |
| DATED | : December 1, 2009 |
| INVENTOR(S) | : Uchibori et al. |

Page 1 of 2

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 159 days.

Title page, add:

Item --(30) Foreign Application Priority Data

July 23, 2002   (JP) ................2002-214029

July 8, 2002    (JP) ................2002-198922--

At column 1, line 2, after the Title please add the header --RELATED APPLICATION DATA--.

At column 2, line 17, after "SrO" please add --.--.

At column 4, lines 43-44, please delete "p-(p-toluene.sulfonylamide)-diphenylamine" and insert therefore, --p-(p-toluene-sulfonylamide)-diphenylamine--.

At column 4, line 45, please delete "4,4'-dioctyl.diphenylamine" and insert therefore, --4,4'-dioctyl-diphenylamine--.

At column 4, lines 46-47, please delete "p,p'-dioctyl.diphenylamine" and insert therefore, --p,p'-dioctyl-diphenylamine--.

Signed and Sealed this

Thirtieth Day of November, 2010

David J. Kappos
*Director of the United States Patent and Trademark Office*

At column 10, line 12, please delete "bodys" and insert therefore, --bodies--.

At column 13, line 18, Claim 9, please delete "naplithylamine" and insert therefore, --naphthylamine--.